US007564259B2

(12) United States Patent
Agarwal et al.

(10) Patent No.: US 7,564,259 B2
(45) Date of Patent: Jul. 21, 2009

(54) DIGITAL CIRCUIT WITH DYNAMIC POWER AND PERFORMANCE CONTROL VIA PER-BLOCK SELECTABLE OPERATING VOLTAGE

(75) Inventors: Kanak B. Agarwal, Austin, TX (US); Damir A. Jamsek, Austin, TX (US); Kevin J. Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 589 days.

(21) Appl. No.: 11/301,728

(22) Filed: Dec. 13, 2005

(65) Prior Publication Data

US 2007/0200593 A1 Aug. 30, 2007

(51) Int. Cl.
*H03K 17/16* (2006.01)
*H03K 19/003* (2006.01)

(52) U.S. Cl. .............................. 326/33; 326/9; 326/10

(58) Field of Classification Search .................. 326/17, 326/33, 37–38
See application file for complete search history.

(56) References Cited

U.S. PATENT DOCUMENTS

| 6,580,930 | B1 | 6/2003 | Fulghum et al. | |
|---|---|---|---|---|
| 6,810,216 | B1 | 10/2004 | Tourunen | |
| 7,266,707 | B2 * | 9/2007 | Ngo et al. | 713/300 |
| 2005/0253462 | A1 * | 11/2005 | Falkowski et al. | 307/43 |

OTHER PUBLICATIONS

Wei, et al., "A Variable-Frequency Paralled I/O interface with Adaptive Power Supply Regulation", *International Solid State Conference*, Feb. 2000, pp. 298-299, Castine, MI, US.

Usami, et al., "Automated Low Power Technique Exploiting Multiple Supply Voltage Applied to a Media Processor," *Custom Integrated Circuit Conf*, May 1997, pp. 131-134, Piscataway, NJ, US.

Gutnik, et al., "Embedded Power-Supply for Low-Power DSP", *IEEE Trans on VLSI Systems*, vol. 5, No. 4, Dec. 1997, pp. 425-435, Piscataway, NJ, US.

Nielson, et al., "Low-Power Operation using Self-Timed Circuits and Adaptive Scaling of the Supply Voltage", *IEEE Trans on VLSI Systems*, vol. 2, No. 4, Dec. 1994, pp. 391-397, Piscataway, NJ, US.

(Continued)

*Primary Examiner*—Anh Q Tran
(74) *Attorney, Agent, or Firm*—Mitch Harris, Atty at Law, LLC; Andrew M. Harris; Libby Z. Handelsman

(57) ABSTRACT

A digital circuit with dynamic power and performance control via per-block selectable operating voltage level permits dynamic tailoring of operating power to processing demand and/or compensation for process variation. A set of processing blocks having a power supply selectable from two different power supply voltage levels is provided. The power level of the overall circuit is set by selecting the power supply voltage for each block to yield a combination of blocks that meets operating requirements. Alternatively, one circuit per pair from a set of pairs of redundant logic blocks supplied by the different power supply voltage levels can be selected to meet the operating requirements. The unselected blocks can be disabled by disabling foot devices or disabling transitions at the inputs to the unselected blocks. Performance measurement and feedback circuits can be included to tune the power consumption and performance level of the circuit to meet an expected level.

16 Claims, 3 Drawing Sheets

OTHER PUBLICATIONS

Burd, et al., "A Dynamic Voltage Scaled Microprocessor System", *IEEE Journal of Solid State Circuits*, vol. 35, No. 11, Nov. 2000, pp. 1571-1580, Piscataway, NJ, US.

Burd, et al., "Design Issues for Dynamic Voltage Scaling", *International Symposium on Low Power Electronic Design*, 2000, pp. 9-14. Rapallo, IT.

Chandrakasan, et al., "Data Driven Signal Processing: An Approach for Energy Efficient Computing", *International Symposium on Low Power Electronic Design*, 1996, pp. 347-352, Monterey, CA, US.

Usami, et al., "Clustered Voltage Scaling Technique for Low-Power Design", *International Symposium on Low Power Electronic Design*, 1995, pp. 3-8., CA, US.

\* cited by examiner

DIGITAL CIRCUIT WITH DYNAMIC POWER AND PERFORMANCE CONTROL VIA PER-BLOCK SELECTABLE OPERATING VOLTAGE

BACKGROUND OF THE INVENTION

1. Technical Field

The present invention relates generally to digital processing circuits, and more particularly, to a digital circuit having selectable processing stages for controlling operating power levels.

2. Description of the Related Art

Portable devices employ a high degree of energy management in present designs and battery life is a critical performance factors in portable devices and systems. Often, resources are not being used to their full capability and during intervals at which resource demand is low, performance can be traded off for power savings without compromising computing or other results.

Control of energy usage via power/performance tradeoffs is well known in digital processing circuits. Typically, the operating voltage level of complementary metal oxide semiconductor (CMOS) circuits and other similar technologies is varied to control the power consumption of a digital circuit. Reduction of the power supply voltage reduces power consumption with a consequent reduction in performance-controlling factors such as maximum frequency of operation and noise margin.

In processing systems, the above technique is employed in dynamic voltage scaling (DVS) power management. Such systems require a complex voltage regulator to ensure that good power supply integrity is provided over the operating supply voltage range and under the dynamic control conditions. The digital circuits themselves also must be designed to operate over the dynamically controlled power supply voltage range, which introduces compromises that produce less-than-ideal operation at any given voltage level and limits the types of technologies that can be used.

Further, DVS has a high level of transition latency and transition energy that limits the rate at which the power supply voltage can be changed for efficient operation. Transition energy is the energy wasted in changing to a new operating voltage and transition latency is the processing delay incurred while the transition is made. Finally, DVS is a system level approach that is applied across an entire processor or other large-scale logic circuit. Higher energy savings can be provided by more fine-grained control that can take into account which units within a system have high processing resource demand and which units have low processing resource demand.

Another existing power management approach is clustered voltage scaling (CVS). However, CVS is not a dynamic technique that can adapt power consumption to resource demand, but rather assigns different voltages at design time, placing higher supply voltages on circuits requiring higher performance and lower supply voltages on circuits that are less critical.

It is therefore desirable to provide a digital circuit and dynamic power management scheme in which the power consumption level can be controlled dynamically without requiring a complex power supply, provides for use of a wider range of technologies and permits more efficient design with low transition overhead.

SUMMARY OF THE INVENTION

The above-stated objectives as well as others is provided in a method and apparatus. The apparatus is a digital circuit and the method is a method of operation of the digital circuit.

A plurality of digital logic blocks is operated from at least two differing power supply voltage levels. The combination of the blocks/voltage levels is selected in conformity with a power consumption/performance control value. A set of digital logic blocks can be supplied through a set of switches that receive at least two different power supply voltage levels and the switches set in conformity with the control value. Alternatively, two or more redundant sets of digital logic blocks can be provided that are supplied from two or more differing power supply levels and a set of operational blocks is selected by selecting the outputs of a particular block from each redundant set in conformity with the control value. The unselected blocks can be disabled by disabling foot devices of the unselected blocks or by disabling transitions at the inputs of the unselected blocks.

A performance measuring circuit can be included that measures the performance of the digital circuit and adjusts the control value via feedback to meet an expected performance level. The feedback can be used to compensate for process variations that cause a rise in power consumption and/or lowered frequency of operation. The performance measuring circuit can be a frequency comparator that compares an output of one of the digital logic blocks with an expected frequency value an increments a measurement counter that adjusts the control value upwards in power consumption level until the expected frequency criteria is met.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
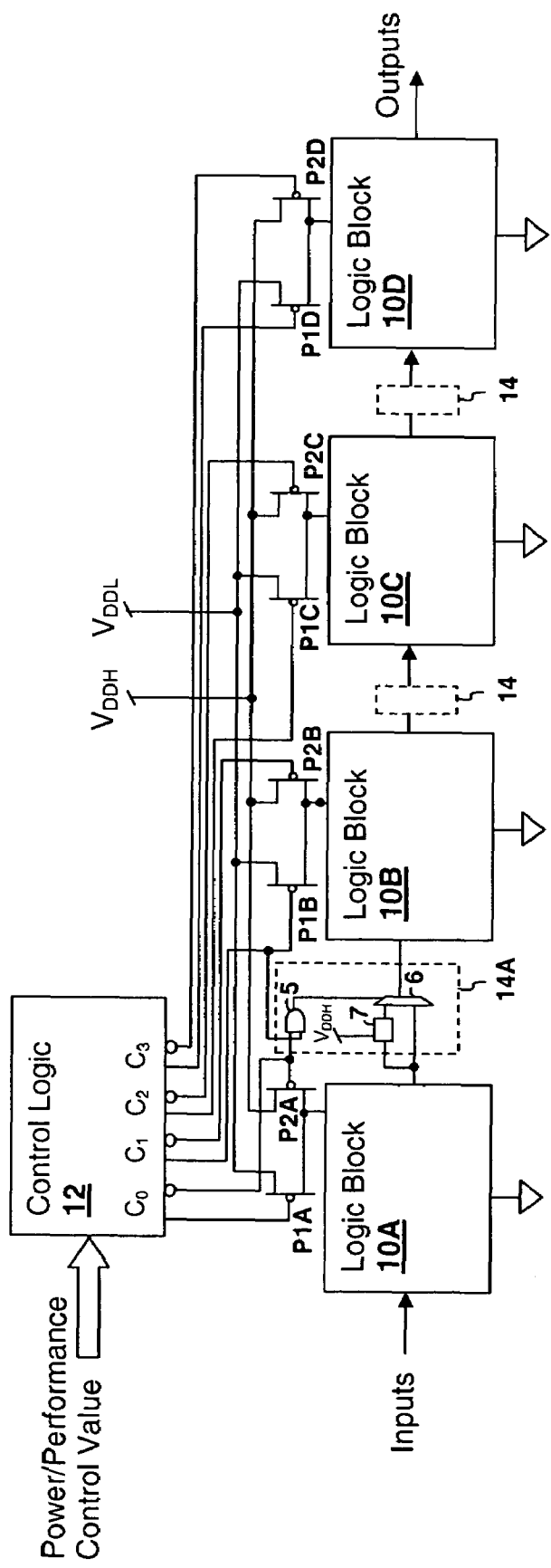
FIG. 1 is a simplified schematic diagram of a digital logic circuit in accordance with an embodiment of the invention.

With reference now to the figures, and in particular with reference to FIG. 1, there is depicted a schematic diagram of a digital logic circuit in accordance with an embodiment of the present invention. A plurality of digital logic blocks 10A-10D are arranged in a cascade. Digital logic blocks 10A-10D receive one or more logic inputs and provide one or more logic outputs and represent a general digital circuit architecture, of which a cascaded configuration is only an example. The present invention may be applied to arbitrary architecture and subdivisions of logic within larger digital circuits, such as functional units within a processor. Digital logic blocks 10A-10D are provided with independently selectable power supply voltage levels, illustrated as two levels $V_{DDH}$ and $V_{DDL}$ but more than two power supply voltage levels may be employed.

Transistors P1A-1D and P2A-2D control the power supply voltage level supplied to each of digital logic blocks 10A-10D and a control logic 12 generates individual complementary outputs for enabling one transistor from each group of transistors P1A-1D or P2A-2D for each block, so that the binary value $C_3C_2C_1C_0$ can potentially set 16 discrete and usable power consumption/performance levels for the circuit of FIG. 1. However, to avoid the requirement of level translators 14, the circuit can be designed so that only five power modes are implemented, as power supply level changes from higher to lower generally do not require level translation. In such a scheme, all digital logic blocks ahead of one of digital logic blocks are 10A-10D operated from the higher power supply voltage level $V_{DDH}$ (or all blocks operated from $V_{DDH}$). The only level restoration will generally be required at the output of the circuit (when the final block is operating at $V_{DDL}$) and the possible power modes progress from all blocks operated at $V_{DDL}$, or an initial string of blocks operated at $V_{DDH}$ and the rest operated at $V_{DDL}$ or finally to all blocks operated at $V_{DDH}$, which represents a progression of power consumption from lower to higher.

However, if the higher to lower power supply scheme is not followed, then level translators 14 are generally used. Level translators 14 can be optionally implemented as shown in an exemplary detailed level translator 14A including a bypass selector 6 that bypasses the level converting block 7 in response to an indication that the input is operating from a higher power supply level than the block fed by the output of the level translator. In level translator 14A, such an indication is provided by the output of a logical AND gate 5 that compares the control signals that select the power supply levels of the previous and next digital logic blocks 10A and 10D. The bypass selector 6 eliminates delays due to level translation when level translation is not needed. When level translators 14 are not bypassed, then there will generally be a performance penalty, but such penalties are more tolerable in the lower-performance modes for which the level translators 14 are not bypassed.

If level translators are included or the logic is tolerant of the small differences in output swing, the relative power consumption levels of logic blocks 10A-10D can be generally apportioned so that a change in voltage supplied to one of digital logic blocks 10A-10D has a largest effect on the power consumption of the entire circuit (for example one-half of the total available change in power consumption). The smallest change can be apportioned at one-sixteenth of the total change, so that a substantially linear power control can be implemented if the other weights are one-fourth and one-eighth of the total possible power change. However, linear control is generally not a requirement, and particular scaling of the size of the circuit partitions represented by digital logic blocks 10A-10D may be dictated by practical considerations (such as division into functional units) or by the resolution and particular steps of power consumption and performance levels desired for programming. For example, performance may not be linear with power level and linear steps in performance may be set by scaling the power consumption changes amongst the digital logic blocks 10A-10D by how many gates or groups of gates are partitioned into each block.

As mentioned above, level translators 14 may not be required between the blocks even for logic going from a lower supply level to a higher one, if the power supply voltage level changes are small compared to digital signal swings. However, when going from low supply to high supply blocks, optimum high-speed performance is usually compromised and conduction leakage due to the difference between input high voltage level and the supply level is increased in the second block. Therefore the high-to-low voltage enforced scheme or the insertion of level translators 14A that can be bypassed is preferable for highest performance of each mode. A swing of approximately 0.8V is generally high enough to operate logic supplied from a 1.0V power supply, and therefore no level translators 14 may be required with small changes in power supply voltage if the lower performance and higher leakage can be tolerated.

Figure 2:
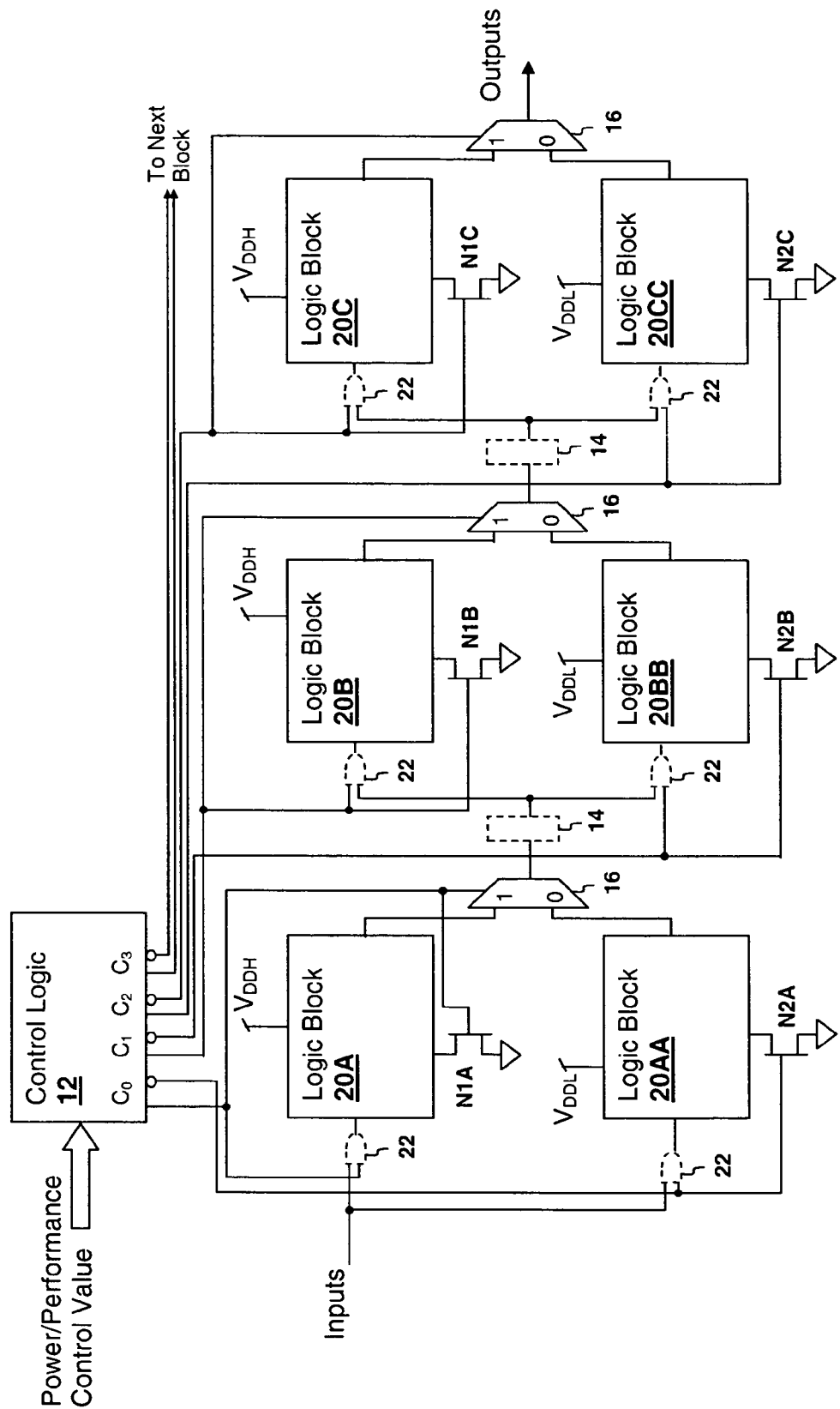
FIG. 2 is a simplified schematic diagram of a digital logic circuit in accordance with another embodiment of the invention.

Referring now to FIG. 2, a schematic diagram of a digital logic circuit in accordance with another embodiment of the present invention is shown. In the depicted circuit, rather than change the voltage supplied to digital logic blocks as in the circuit of FIG. 1, redundant pairs of digital logic blocks 20A, 20AA; 20B, 20BB and 20C, 20CC are provided. Digital logic blocks 20A-20D are supplied from a higher-voltage power supply distribution bus $V_{DDH}$, while digital logic blocks 20AA-20CC are supplied from a lower power supply voltage distribution bus $V_{DDL}$. Selection of power consumption is again made by control logic 12 as in the circuit of FIG. 1 and again, the earlier blocks in the path are generally selected as the higher-voltage blocks. However, control logic 12 controls the signal path through the digital circuit of FIG. 2 by controlling selectors 16 and by disabling one of each of the pairs of digital logic blocks 20A,20AA; 20B,20BB and 20C,20CC by turning off one of foot devices N1A-N1C or N2A-N2C that provides the return path for the particular block to be disabled. Logical AND gates 22 or alternatively a pass gate or transistor may also or alternatively be included to disable power consumption in the disabled logic blocks and loss due to leakage at the inputs and capacitive loading in particular technologies. Level translators 14 may be included as in the circuit of FIG. 1.

The circuit of FIG. 2, while requiring more chip area for implementation due to the redundant logic, has some advantage in that each group of digital logic blocks 20A-20C and 20AA-20CC can be optimized for operation at the particular voltage levels $V_{DDL}$ and $V_{DDH}$, while digital logic blocks 10A-10D of FIG. 1 must be designed for operation at both voltage levels.

Thus the invention, in the two embodiments depicted above, provides a mechanism for arranging different power supply voltage levels among a collection of subcircuits within a digital circuit and thereby providing adjustment of power consumption and performance in response to a power/performance control value. The transition energy and latency are very low compared to DVS systems, where the entire power supply rail is changed. Adjustment of power consumption may be made in conformity with a desired power usage or energy/power availability, such as in battery operated equipment and/or may be made in conformity with detected resource requirement, such as in so-called "green" systems where when resource demand is not high, it is desirable to reduce power consumption.

Figure 3:
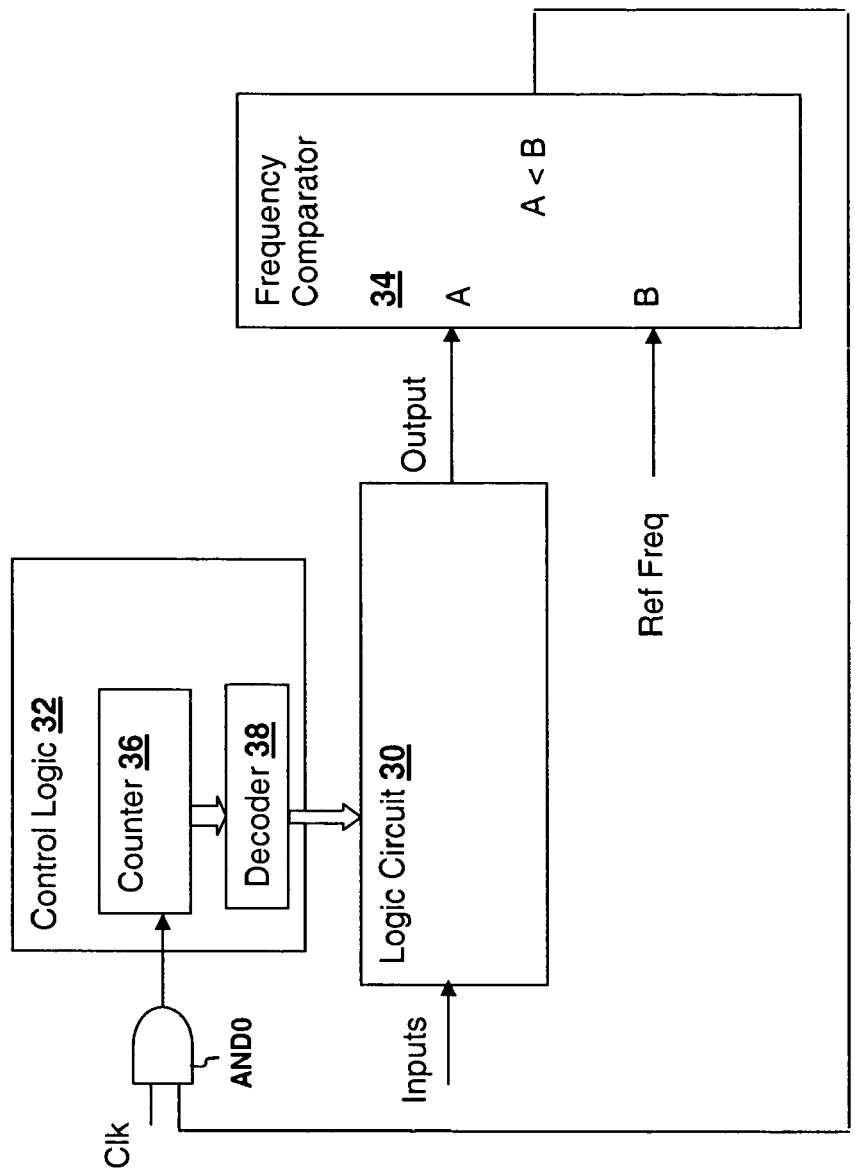
FIG. 3 is a block diagram of a digital logic circuit in accordance with another embodiment of the invention.

Referring now to FIG. 3, a block diagram of a circuit in accordance with another embodiment of the invention is shown. The depicted circuit is a measurement circuit that adapts the performance level and power consumption of the circuit in conformity with a measured value of performance. A digital logic circuit 30, which may be of the form of the circuit of FIG. 1 (per-block selected power supply voltage) or the circuit of FIG. 2 (blocks selected from redundant pairs) processes inputs and produces at least one output that is received by a frequency comparator 34. In general, frequency comparator 34 may measure the output frequency of any usable output from digital logic circuit 30, but a specific clock test path through digital logic circuit 30 in most cases will provide the fastest and most consistent measurement input.

Frequency comparator 34 compares the frequency of the measured output of digital logic circuit 30 with a reference frequency Ref Freq and enables a clock input Clk through logical AND gate AND0 that increments a counter 36 within a control logic 32 that supplies a set of control bits as shown in the circuits of FIG. 1 and FIG. 2 for setting a power consumption/performance level. Until the output frequency of the measurement output of digital logic circuit 30 reaches the desired frequency set by reference frequency Ref Freq, an increasing count of counter 36 increases the power consumption and thus the performance of logic circuit 30 by changing the outputs of decoder 38 to switch increasing portions of logic circuit 30 (but not necessarily more "blocks" as they are generally not uniform in size as mentioned above) to the higher-voltage power supply.

The circuit of FIG. 3 represents a circuit that can adapt the operation of a digital circuit over process variations to yield similar performance from part to part, correcting for excess power consumption and/or lowered performance.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A digital circuit having a dynamically controllable power consumption level, comprising:
    a plurality of interconnected digital logic blocks;
    a first power supply distribution bus for supplying a first power supply voltage;
    a second power supply distribution bus for supplying a second power supply voltage having a magnitude lower than that of said first power supply voltage;
    a plurality of selectors having at least one switching circuit corresponding to each of said plurality of digital logic blocks; and
    a control circuit having outputs coupled to each of said switching circuits for setting said dynamically controllable power consumption level by setting a state of said plurality of selectors, wherein said plurality of digital logic blocks comprises a plurality of redundant pairs of digital logic blocks, one of each pair connected to said first power supply distribution bus and the other connected to said second power supply distribution bus, and wherein said plurality of selectors includes a selector corresponding to each redundant pair for selecting between an outputs of a first and second one of said redundant pair, and wherein said control circuit adjusts said dynamically selectable level of power consumption by setting combinations of active digital logic blocks by selecting one active digital logic block from each of said redundant pairs.

2. The digital circuit of claim 1, wherein each of said plurality of digital logic blocks includes a foot device coupled to said control circuit, and wherein said control circuit deactivates all foot devices for digital logic blocks not selected by said plurality of selectors.

3. The digital circuit of claim 1, wherein each of said plurality of digital logic blocks includes an input disable circuit for disabling transitions at an input of each of said digital logic blocks not selected by said plurality of selectors.

4. The digital circuit of claim 1, wherein said plurality of digital logic blocks implements a cascaded digital circuit, wherein said control circuit sets an operating power supply level for each stage in said cascaded digital circuit, and wherein said control circuit sets said operating power supply level of earlier stages to a higher operating power supply level than subsequent stages.

5. The digital circuit of claim 1, further comprising:
    a performance measuring circuit for determining an operating performance level of said digital circuit; and
    a feedback circuit coupled to said control circuit for setting said dynamically controllable power consumption level in conformity with a measured performance level.

6. The digital circuit of claim 5, wherein said feedback circuit sets said dynamically controllable power consumption level such that deviation in performance of said digital circuit from expected performance that is due to process variation is compensated.

7. The digital circuit of claim 5, wherein said performance measuring circuit comprises frequency comparator for comparing an output of a given one of said digital logic blocks to an expected frequency and wherein said feedback circuit comprises a counter for counting a number of measurement cycles for which said output of said given digital logic block is less than said expected frequency and wherein an output of said counter is coupled to said control circuit for adjusting said power consumption level upward until said comparator indicates that said output of said given digital logic block has met or exceeded said expected frequency.

8. The digital circuit of claim 1, further comprising a plurality of level shifters interposed between said plurality of digital logic blocks, whereby differences in power supply voltage between said digital logic blocks are compensated.

9. A method of dynamically controlling power consumption in a digital circuit comprising a plurality of interconnected digital logic blocks, said method comprising:
    receiving a power consumption control value; and
    setting an operating power supply voltage level of a set of said interconnected digital logic blocks within said digital circuit to at least two differing voltage levels in conformity with said power consumption control value, wherein said setting is performed by enabling only one given logic block each from at least two redundant ones of said interconnected digital logic blocks, wherein each of said at least two redundant digital logic blocks is supplied with said differing voltage levels.

10. The method of claim 9, wherein said enabling is performed by turning on foot devices of said given logic blocks, and wherein other foot devices of other ones of said redundant digital logic blocks are disabled in conformity with said control value.

11. The method of claim 9, wherein said enabling is performed by enabling signal transitions at inputs of said given logic blocks, and wherein other ones of said redundant digital logic blocks are disabled by blocking signal transitions at input of said other logic blocks in conformity with said control value.

12. The method of claim 9, further comprising:
    measuring a performance level of said set of digital logic blocks; and adjusting said control value in conformity with said measured performance level.

13. The method of claim 12, wherein said measuring measures a deviation in performance from an expected performance due to process variation and wherein said adjusting compensates for said process variation.

14. The method of claim 12, wherein said measuring comprises comparing an operating frequency at an output of a given one of said set of digital logic blocks with an expected frequency, and wherein said adjusting comprises counting a number of measurement cycles for which said output of said given digital logic block is less than said expected frequency and adjusting said power consumption level upward until said comparing indicates that said output of said given digital logic block has met or exceeded said expected frequency.

15. A digital circuit having a dynamically controllable power consumption level, comprising:
   a plurality of interconnected digital logic blocks;
   a first power supply distribution bus for supplying a first power supply voltage;
   a second power supply distribution bus for supplying a second power supply voltage having a magnitude lower than that of said first power supply voltage;
   a plurality of selectors having at least one switching circuit corresponding to each of said plurality of digital logic blocks;
   a performance measuring circuit for determining an operating performance level of said digital circuit;
   a control circuit having outputs coupled to each of said switching circuits and an input coupled to an output of said performance measuring circuit for setting said dynamically controllable power consumption level by setting a state of said plurality of selectors in conformity with said operating performance level.

16. The digital circuit of claim 15, wherein said performance measuring circuit measures a deviation in performance of said digital circuit from expected performance that is due to process variation and wherein said control sets said dynamically controllable power consumption level such that said deviation is compensated.

* * * * *